US005788876A

United States Patent [19]

Chen

[11] Patent Number: 5,788,876
[45] Date of Patent: Aug. 4, 1998

[54] COMPLEX SUBSTITUTED LANTHANUM-LEAD-ZIRCONIUM-TITANIUM PEROVSKITE, CERAMIC COMPOSITION AND ACTUATOR

[75] Inventor: Zhien-Chi Chen, Aachen, Germany

[73] Assignee: U.S. Philips Corporation, New York, N.Y.

[21] Appl. No.: 564,890

[22] Filed: Nov. 29, 1995

[30] Foreign Application Priority Data

Nov. 30, 1994 [DE] Germany ............ 44 42 598.8

[51] Int. Cl.$^6$ ................................. C04B 35/46
[52] U.S. Cl. .................. 252/62.9 PZ; 501/135; 501/136
[58] Field of Search ............ 252/62.9; 501/135, 501/136; C04B 35/460

[56] References Cited

U.S. PATENT DOCUMENTS

| | | | |
|---|---|---|---|
| 3,663,440 | 5/1972 | Thomann | 252/62.9 PZ |
| 4,383,196 | 5/1983 | Perduijn et al. | 252/62.9 PZ |
| 4,474,894 | 10/1984 | Hardtl | 501/136 |
| 4,716,134 | 12/1987 | Yamaguchi et al. | 501/135 |
| 4,744,972 | 5/1988 | Ogata et al. | 501/136 |
| 4,882,078 | 11/1989 | Nishimura et al. | 252/62.9 PZ |
| 4,985,381 | 1/1991 | Mori et al. | 501/136 |
| 5,182,695 | 1/1993 | Handa et al. | 501/136 |
| 5,378,382 | 1/1995 | Nishimura et al. | 501/136 |

FOREIGN PATENT DOCUMENTS

| | | |
|---|---|---|
| 0423822 | 4/1991 | European Pat. Off. |
| 2-123063 | 6/1987 | Japan. |
| 2123064 | 6/1987 | Japan. |
| 63-117959 | 5/1988 | Japan. |
| 63-151667 | 6/1988 | Japan. |
| 02009757 | 1/1990 | Japan. |
| 5 17214 | 1/1993 | Japan. |
| 6714565 | 10/1967 | Netherlands. |

Primary Examiner—Mark L. Bell
Assistant Examiner—Louis M. Troilo
Attorney, Agent, or Firm—Norman N. Spain

[57] ABSTRACT

A lanthanum-lead-zirconium-titanium perovskite having the general composition $Pb_{1-a}La_a(Mg_{x/2}W_{x/2})Ti_yZr_zO_3$, wherein $0.01 \leq a \leq 0.05$, $0.01 \leq x \leq 0.06$, $0.4 \leq y \leq 0.5$, $0.4 \leq x \leq 0.5$, and $x+y+z=1$, which is doped with 0.5–2 mol % $MnO_2$, has very good hard piexoelectric properties, for example a low loss factor tan $\delta$ and a high quality factor. This perovskite does not degrade under direct-current conditions. Since it has low sintering temperatures, it can be used to manufacture multilayer actuators having hard piezoelectric properties. A piezoelectric ceramic composition comprising such a perovskite can very suitably be used for hard multilayer actuators.

6 Claims, No Drawings

COMPLEX SUBSTITUTED LANTHANUM-LEAD-ZIRCONIUM-TITANIUM PEROVSKITE, CERAMIC COMPOSITION AND ACTUATOR

FIELD OF THE INVENTION

The invention relates to a complex, substituted lanthanum-lead-zirconium-titanium perovskite as well as to a piezoelectric, ceramic composition and an actuator.

BACKGROUND OF THE INVENTION

In the electronics industry there is an increasing demand at present for components which are electronically controlled to carry out small mechanical adjustments, for example for ink jet printers and matrix printers, fuel injection in cars, drive mechanisms, autofocus for cameras and such. These type of components are referred to as "actuators". They are manufactured from piezoelectric ceramic materials. Actuators lengthen or shorten under the influence of an electric field. They are methaphorically referred to as the "muscles of microelectronics".

The use of complex, polysubstituted lead-zirconium-titanium-perovskites (PZT) as piezoelectric, ceramic materials is known per se. For example in published European Patent Application EP 0 423 822 A1, there is disclosed a ferroelectric ceramic, i.e. in the narrower sense a piezoelectric ceramic, which is a perovskite mixed crystal and which comprises a mixed crystal (solid solution) having the following formula:

$Pb_{1-(3/2)a}M_{a\{(Ni1/3Nb2/3)1-b}(Zn_{1/3}Nb_{2/3})_b\}_x Ti_y Zr_z O_3$, wherein M is at least an element from the group composed of La and Nd, x+y+z is 1, a may range from 0.005 to 0.03, b may range from 0.5 to 0.95, x may range from 0.1 to 0.4, y may range from 0.3 to 0.5 and z may range from 0.2 to 0.5, and the piezoelectric ceramic comprising $MnO_2$ in a quantity of 0.3 to 1.0 wt. % of the perovskite mixed crystal.

Further, published Netherlands Patent Applicatiaon NL-A-6714565 discloses a method of manufacturing a piezoelectric, ceramic material, in which a material of the composition $(Pb(Mg.W)_{1/2}O_3)_x$—$(PbTiO_3)_y$, comprising $(PbZrO_3)_{(1-x-y)}$, is prepared with such values for x and y that the composition in the three-phase diagram

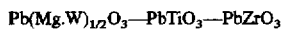

falls within the polygon ABCDEFGA, which is defined by the following Table:

|   | $Pb(Mg.W)_{1/2}O_3$ mol % | $PbTiO_3$ mol % | $PbZrO_3$ mol % |
|---|---|---|---|
| A | 0.05 | 0.15 | 0.80 |
| B | 0.05 | 0.35 | 0.60 |
| C | 0.05 | 0.55 | 0.40 |
| D | 0.05 | 0.80 | 0.15 |
| E | 0.10 | 0.80 | 0.10 |
| F | 0.10 | 0.10 | 0.10 |
| G | 0.10 | 0.10 | 0.80 |
| A | 0.05 | 0.15 | 0.80 |

The mixture of the 3 components is mixed, ground, pressed, slowly heated and baked at 1100 –1200° C. for 3 hours, whereafter it is baked at 1200°–1300° C. for 1 hour and subsequently cooled. The starting mixture may additionally be provided with 0.1–5 weight percent of at least one of the oxides of iron, chromium, manganese or of the rare earth metals, for example lanthanum, or niobium.

The technical parameters which are important for actuators are the so-called piezoelectric small-signal parameters. Such parameters are the charge constant d, which denotes the ratio between the relative mechanical expansion S and the applied field intensity E according to S=d*E, the coupling factor k, whose square $k^2$ is a measure of the conversion of electrical energy into mechanical energy, and the relative permittivity $\epsilon/\epsilon_0$. Other important factors are the dielectric loss factor tan δ and the quality factor for radial vibrations $Q_m^E$.

These small-signal parameters are material-dependent and temperature-dependent. There are "hard" and "soft" piezoelectric oxide ceramics. "Soft" piezoelectric ceramics have a low quality factor for radial vibrations, they dampen applied vibrations and are suitable for quasi-static applications. Hard piezoelectric ceramics have low loss factors and high quality factors of>100. They are preferably used for high-frequency applications.

The well-known, hard piezoelectric ceramics change their properties under dirept-current conditions (see R. Waser, T. Baiatu and K. H. Hardtl, 3. Am. Ceram. Soc. 73 (1990), 1645). In addition, the well-known, hard piezoelectric oxides have very high sintering temperatures. As a result, they are unsuitable for multilayer actuators in which electrodes and piezoelectric ceramics must be co-sintered as a multilayer stack.

SUMMARY OF THE INVENTION

It is an object of the invention to provide a complex, substituted lanthanum-lead-zirconium-titanium perovskite which yields a piezoelectrically hard ceramic material which does not degrade under direct-current conditions and can be sintered at low temperatures.

This object is achieved by a lead-lanthanum-zirconium-titanium perovskite having the composition $Pb_{1-a}La_a(Mg_{x/2}W_{x/2})Ti_y Zr_z O_3$, wherein $0.01 \leq a \leq 0.05$; $0.01 \leq x \leq 0.06$; $0.4 \leq y \leq 0.5$, $0.4 \leq z \leq 0.5$, and x+y+z=1, with the perovskite being doped with 0.5–2 mol% $MnO_2$.

Such a material has very good hard piezoelectric properties, for example a low loss factor tan δ and a high quality factor, and it is not subject to ageing under direct-current conditions. Since it can be sintered at low temperatures, it can be used to manufacture multilayer actuators having hard, piezoelectric properties.

By virtue of the favourable combination of properties, the material can also advantageously be used to manufacture simple actuators for servomotors, vibrators, hybrid motors as well as for sonars and transducers.

In accordance with a preferred embodiment, a=0.03 and x=0.05.

In a particularly preferred embodiment, the dopant consists of 1.6 mol % $MnO_2$. Such a material has a very high quality factor.

The invention also relates to a ceramic composition which comprises at least a lanthanum-lead-zirconium-titanium perovskite in accordance with the invention as well as 0.1 to 20 mol % of a lead-containing sintering agent. This lead-containing sintering agent brings about a liquid-phase sintering process.

The invention further relates to an actuator, particularly an actuator having a multilayer structure, comprising at least one layer which contains a complex, manganese-substituted, lanthanum-lead-zirconium-titanium perovskite in accordance with the invention. This actuator has hard piezoelectric properties and is stable for a very long time.

These and other aspects of the invention will be apparent from and elucidated with reference to the embodiments described hereinafter.

DESCRIPTION OF THE INVENTION

The designation "perovskite" is derived from the mineral perovskite. Such designation is generally used for compounds having the composition $ABO_3$ and a cubic or pseudo-cubic crystal structure. In this crystal structure, the A-ions occupy the corners of a cube and the B-ions are located in the center of the cube. The oxygen ions are located in the centers of the surfaces of the cube.

Only a few compounds, for example the mineral $CaTiO_3$ by itself, have an ideal perovskite crystal structure. The wide spectrum of properties of industrially manufactured perovskites is based, however, on the adaptability of the perovskite structure, which enables many, both simple and complex, changes in structure.

In the case of variants of the perovskite structure, which do not have a center of symmetry in the crystal structure, a dipole moment can be produced in the crystal by subjecting the crystallites to an electric field. The variants of the perovskite structure are found, in particular, in the titanium-containing perovskites $ATiO_3$. Materials which can be polarized in this manner and whose directions of polarization can be changed by means of an electric field are referred to as ferroelectric materials.

The cations which have exited from the center of symmetry bring about the piezoelectricity of a few titanates having the perovskite structure. When an electric field moves the titanium atoms, the shape of the entire titanium-perovskite crystal changes, that is it becomes slightly longer in one direction. Conversely, an electric field is generated when the crystal is mechanically deformed. These piezoelectric properties make it possible to use these titanium perovskites for the conversion of mechanical energy into electrical energy and conversely. Solid solutions (mixed crystals) of lead titanate with lead zirconate as well as substitution mixed crystals derived therefrom have the best piezoelectric properties.

Further substitutions on the A or B lattice sites of lead zirconium titanate yield an entire group of commercially important perovskites which are given the abbreviation NPZTN. Of particular importance are lanthanum-substituted "LPZTs".

Perovskites which are formed on a lattice site as a result of coupled substitution with ions of a different valence, are referred to as "complex perovskites".

The complex, oxidic perovskite derivatives in accordance with the invention are derived from the well-known, complex lanthanum-lead-zirconium-titanium phases (LPZT), which were obtained by coupled substition with magnesium and tungsten, by incorporating additional manganese cations. It is assumed that these manganese cations are incorporated on the B-sites in the perovskite lattice.

However, this theoretical consideration only serves to explain the invention and does not limit the invention.

For the manufacture of the perovskites in accordance with the invention use can be made of customary methods. A standard method is -the "mixed oxide" technique. In this technique, the binary oxides of the relevant cations are weighed in the molar ratio in accordance with the formula to form a premixture. The oxides are wet-ground in a ball mill, for example in an agate crucible comprising agate balls having a diameter of 10 mm and cyclohexane as the solvent for 2 hours.

The premixture can also be obtained, however, from the corresponding starting compounds by means of co-precipitation, sol-gel processes or hydrothermal synthesis.

After drying, the premixture is calcined, for example at 800° C. for 10 hours, at a heating and cooling rate of 200° C./h.

The powders can be sintered-dense without sintering agents. However, it is an aspect of the invention to provide a ceramic composition in which the inventive, complex, substituted perovskites are mixed with a lead-containing sintering agent, such as PbO and $PbZrO_3$. The sintering agents cause the starting powders to undergo a liquid-phase sintering operation and form a homogeneously distributed second phase, which may be amorphous or crystalline, in the finally sintered ceramic composition.

The calcined powders or the ceramic compositions comprising a sintering agent are subjected again to grinding in a ball mill for 2 hours under the same conditions. Subsequently, they are ground by a roll-type grinder, for example, for 20 hours using cyclopropanol as the solvent and yttrium-stabilized $ZrO_2$ balls having a diameter of 2 mm.

The starting powders are first pre-pressed on a block press and then isostatically pressed into the final shape at a pressure of 320 MPa. The finished mouldings are subsequently sintered at sintering temperatures of 1075° C. to 1100° C. in an oxygen atmosphere on $ZrO_2$ substrates for two hours.

EXEMPLARY EMBODIMENTS

Embodiment 1

$Pb_{0.97}La_{0.03}Ti_{0.44}Zr_{0.46}Mg_{0.05}W_{0.05}O_3$ comprising 1.6 mol-% $MnO_2$ For the raw materials use is made of reagents produced by Merck, Darmstadt, whose degree of purity is "p.a.".

The following starting materials 216.49 g PbO, 4.88 g $La_2O_3$, 35.16 g $TiO_2$, 56.81 g $ZrO_2$, 10.79 g $WO_3$ 2.02 g MgO and 1.39 g $MnO_2$ are suspended in isopropanol and ground in an agate ball mill for 6 hours. After grinding, the suspension is dried under a surface evaporator at approximately 120° C. and, subsequently, prefired in air in a corundum sintering crucible having a detachable cover for 12 hours at 800° C.

The powder mixture which has been pre-reacted at 800° C. is mixed with 345.09 g $PbZrO_3$ and ground for the second time in an isopropanolic suspension in a ball mill with yttrium-stabilized $ZrO_2$ balls (diameter 2 mm) for 20 hours. The ground powder is subjected to a cold-isostatic pressing operation at a pressure of 320 mPa to form prismatic bodies measuring 6×6×15 $mm^3$.

The samples are heated to 1100° C. at a rate of 320° C./h and sintered in an oxygen flow at 1100° C. for 2 hours. For the substrate use is made of plates of stabilized $ZrO_2$ or of the same LPZT material. A density of 98% was attained.

A series of further manganese-doped LPZTs, whose composition is shown in Table 1, were manufactured in the same manner.

TABLE 1

Chemical composition

| No. | CHEMICAL COMPOSITION |
|-----|---------------------|
| 1 | $Pb_{0.99}La_{0.01}Ti_{0.46}Zr_{0.49}Mg_{0.025}W_{0.025}O_3$ + 1.6% $MnO_2$ |
| 2 | $Pb_{0.985}La_{0.015}Ti_{0.46}Zr_{0.44}Mg_{0.05}W_{0.05}O_3$ + 1.6% $MnO_2$ |
| 3 | $Pb_{0.97}La_{0.03}Ti_{0.45}Zr_{0.50}Mg_{0.025}W_{0.025}O_3$ + 1.6% $MnO_2$ |
| 4 | $Pb_{0.985}La_{0.015}Ti_{0.47}Zr_{0.48}Mg_{0.025}W_{0.025}O_3$ + 0.8% $MnO_2$ |
| 5 | $Pb_{0.99}La_{0.01}Ti_{0.47}Zr_{0.48}Mg_{0.025}W_{0.025}O_3$ + 0.8% $MnO_2$ |
| 6 | $Pb_{0.99}La_{0.01}Ti_{0.47}Zr_{0.49}Mg_{0.02}W_{0.02}O_3$ + 1.6% $MnO_2$ |
| 7 | $Pb_{0.985}Gd_{0.015}Ti_{0.46}Zr_{0.49}Mg_{0.025}W_{0.025}O_3$ + 0.8% $MnO_2$ |

To determine the relevant piezoelectric small-signal parameters of the ceramic material in accordance with the invention, cylinders having a diameter of 5 mm were cut from the sintered ceramic material. The cylinders were sawn into sheets having a thickness of 0.4 mm and lapped. Subsequently, to carry out electrical measurements, contacts of Au having a thin adhesive layer of Ni/Cr were deposited on both sides of the plates by vacuum evaporation.

The dielectric and piezoelectric properties were determined before or after the polarization process. The discs were polarized by exposing them, under silicone oil, to a field of 0.35 kV/100 μm at 150° C. for 2 minutes.

The relevant piezoelectric small-signal parameters were determined from the resonance behaviour of the axially poled ceramic discs by means of an impedance bridge. For this purpose use was made of a computer program which enabled the resonance behaviour and the capacitance of thin, round, axially poled discs to be determined.

All measurements were carried out by means of a Hewlett Packard-4194A impedance analyser in combination with a HP-9000/-300 computer. The measured values were used to calculate the dielectric constants and the small-signal parameters. The results are listed in an abbreviated form in Table 2.

In addition, ground sections were used to examine the microstructure of the ceramic compositions in accordance with the invention.

The long-term behaviour of the ceramic compositions in relation to their direct-current resistance was determined by means of an ALT-test (Accelerated Life Test). For this purpose, the direct-current resistance was measured at 250° C. and 1 V/μm.

In the case of a material which is doped with 0.8 mol% $MnO_2$, the ALT-test showed that after 100 hours the direct-current resistance amounted to 10% of the original value. In the case of a material which was doped with 1.6 mol % $MnO_2$ the direct-current resistance was unchanged even after 100 hours under ALT conditions.

TABLE 2a

Piezoelectric properties before poling

| Composition 1: $Pb_{0.97}La_{0.03}Ti_{0.44}Zr_{0.46}Mg_{0.05}W_{0.05}O_3$ comprising | | | | 0.8 mol-% $MnO_2$. | |
|---|---|---|---|---|---|
| Composition 2: $Pb_{0.97}La_{0.03}Ti_{0.44}Zr_{0.46}Mg_{0.05}W_{0.05}O_3$ comprising | | | | 1.6 mol-% $MnO_2$. | |

| | $\epsilon/\epsilon_0$ | tan δ | ρ | Sinter-temp. | ALT |
|---|---|---|---|---|---|
| 1 | 1705 | 0.5 | 8.07 | 1100 | 0.1 |
| 2 | 1768 | 0.5 | 8.02 | 1100 | 100% |

TABLE 2b

Piezoelectric properties after poling

| | $\epsilon/\epsilon_0$ | tan δ | $k_{31}$ | $d_{31}$ in $10^{-12}$ m/V | k | Q |
|---|---|---|---|---|---|---|
| 1 | 2088 | 0.8 | 0.37 | 181 | 0.63 | 207 |
| 2 | 1594 | 0.5 | 0.35 | 142 | 0.58 | 595 |

Exemplary embodiment 2

In the manufacture of a multilayer actuator, green ceramic foils are manufactured first. For this purpose, the calcined powder mixtures are manufactured as described above. If necessary, sintering agents are added to the powder mixtures. These ceramic compositions are ground with a solvent, preferably water, and appropriate liquefiers, whereafter they are mixed with binders, plasticizers, wetting agents and release agents to form a castable slurry.

The arrangement for casting foils comprises, in principle, a continuous steel band which moves horizontally over two rollers. The slurry passes continuously from a container at one end of the casting band, through an adjustable aperture, on to the steel band. The thickness of the foils can be varied between 0.2 and 1.5 mm by varying the height of the aperture. The foil is dried and then reeled or instantly cut into cards.

The inner electrodes are provided on the green cards by providing the electrode pattern by means of a metallizing paste in a screen-printing process. The metallizing pastes customarily comprise silver or palladium alloys.

The metallized cards are stacked and subjected to a pressure of 300 MPa to form a laminated plate. The plate is subjected to a temperature treatment to burn out the binder, whereafter the ceramic material is dense-sintered at higher temperatures. Typical sintering conditions for the manganese-containing compositions in accordance with the invention are 1150° C., residence time 2 h, heating and cooling rates 320° C./h. After they have been subjected to the final sintering operation, the ceramic layers have a thickness in the range from 5 to 15 mm.

The plates are cut into individual half-finished products. The exposed inner electrodes are provided with end contacts.

I claim:

1. A lanthanum-lead-zirconium-titanium perovskite having the general composition

$Pb_{1-a}La_a(Mg_{x/2}W_{x/2})Ti_yZr_zO_3$, wherein $0.01 \leq a \leq 0.05$, $0.01 \leq x \leq 0.06$, $0.4 \leq y \leq 0.5$ and $0.4 \leq z \leq 0.5$, and $x+y+z=1$, said perovskite being doped with 0.5–2 mol % $MnO_2$.

2. A complex, substituted lanthanum-lead-zirconium-titanium perovskite as claimed in claim 1, characterized in that a=0.03 and x=0.05.

3. A complex, substituted lanthanum-lead-zirconium-titanium perovskite as claimed in claim 2, characterized in that the dopant is $MnO_2$ in a quantity of 1.6 mol %.

4. A ceramic composition for piezoelectric components, characterized in that it comprises at least a lanthanum-leadzirconium-titanium perovskite in accordance with the claim 1 and 0.1 to 20 mol % of a lead-containing sintering agent.

5. A complex, substituted lanthanum-lead-zirconium-titanium pervoskite as claimed in claim 1, characterized in that the dopant of $MnO_2$ is present in a quantity of 1.6 mol %.

6. An actuator comprising an electrode layer provided between, and contacting, two layers of: a lanthanum-lead zirconium-titanium perovskite having the general composition $$Pb_{1-a}La_a(Mg_{x/2}W_{x/2})Ti_yZr_zO_3,$$

wherein $0.01 \leq a \leq 0.05$ $0.01 \leq x \leq 0.06$ $0.4 \leq y \leq 0.5$ and $0.4 \leq z \leq 0.5,$ and $x+y+z=1$, said perovskite being doped with 0.5–2 mol % $MnO_2$.

* * * * *